(12) United States Patent
Liu

(10) Patent No.: US 12,474,634 B2
(45) Date of Patent: Nov. 18, 2025

(54) MASK SYNTHESIS INTEGRATING MASK FABRICATION EFFECTS AND WAFER LITHOGRAPHY EFFECTS

(71) Applicant: Synopsys, Inc., Mountain View, CA (US)

(72) Inventor: Peng Liu, Cupertino, CA (US)

(73) Assignee: Synopsys, Inc., Sunnyvale, CA (US)

( * ) Notice: Subject to any disclaimer, the term of this patent is extended or adjusted under 35 U.S.C. 154(b) by 581 days.

(21) Appl. No.: 17/985,008

(22) Filed: Nov. 10, 2022

(65) Prior Publication Data

US 2023/0152683 A1    May 18, 2023

Related U.S. Application Data

(60) Provisional application No. 63/280,841, filed on Nov. 18, 2021.

(51) Int. Cl.
*G03F 7/00* (2006.01)
*G03F 1/36* (2012.01)
*G03F 1/70* (2012.01)

(52) U.S. Cl.
CPC ............ *G03F 1/70* (2013.01); *G03F 7/70283* (2013.01); *G03F 7/705* (2013.01)

(58) Field of Classification Search
CPC ........ G03F 1/70; G03F 7/70283; G03F 7/705; G03F 1/78; G03F 1/36; G03F 7/70441
See application file for complete search history.

(56) References Cited

U.S. PATENT DOCUMENTS

| | | |
|---|---|---|
| 7,587,704 B2 | 9/2009 | Ye et al. |
| 7,703,069 B1 | 4/2010 | Liu et al. |
| 8,938,696 B1 | 1/2015 | Torunoglu et al. |

(Continued)

FOREIGN PATENT DOCUMENTS

| | | |
|---|---|---|
| EP | 1465016 A2 | 10/2004 |
| JP | 2009-204823 A | 9/2009 |

(Continued)

OTHER PUBLICATIONS

Taiwan Intellectual Property Office, Office Action, Taiwanese Patent Application No. 110134568, Jun. 6, 2025, 22 pages.

(Continued)

*Primary Examiner* — Nghia M Doan
(74) *Attorney, Agent, or Firm* — Fenwick & West LLP

(57) ABSTRACT

In some aspects, an integrated model accounts for effects from both the mask fabrication process and the wafer lithography process. The aerial image incident on the wafer, the pattern printed on the wafer, and/or measures of the foregoing are estimated using an integrated three-dimensional mask (M3D) model, as follows. The shapes in the mask fabrication description are partitioned into feature images. Each feature image is convolved with a corresponding M3D filter. The M3D filter represents an electromagnetic scattering effect of that feature image in the wafer lithography process, and the feature image and/or M3D filter account for effects on the layout geometry from the mask fabrication process. This is done without estimating the mask pattern printed on the lithographic mask. The mask fabrication description is modified based on differences between the estimated lithography results and corresponding target results.

20 Claims, 11 Drawing Sheets

(56) References Cited

U.S. PATENT DOCUMENTS

| | | | |
|---|---|---|---|
| 10,451,563 | B2 | 10/2019 | Sousa et al. |
| 2014/0195993 | A1* | 7/2014 | Liu .......................... G03F 1/36 716/51 |
| 2015/0378264 | A1 | 12/2015 | Liu |
| 2017/0147734 | A1 | 5/2017 | Rosenbluth |
| 2020/0004161 | A1 | 1/2020 | Yu et al. |
| 2020/0380362 | A1 | 12/2020 | Cao et al. |
| 2021/0064811 | A1 | 3/2021 | Liu et al. |
| 2021/0397080 | A1* | 12/2021 | Yeo .......................... G03F 7/705 |

FOREIGN PATENT DOCUMENTS

| | | |
|---|---|---|
| JP | 2010-176144 A | 8/2010 |
| JP | 2015-513208 A | 4/2015 |
| JP | 2016-507786 A | 3/2016 |
| KR | 10-2014-0101814 A | 8/2014 |
| KR | 10-2015-0124967 A | 11/2015 |
| TW | 201921095 A | 6/2019 |
| WO | WO 2013/079316 A2 | 6/2013 |
| WO | WO 2014/127985 A1 | 8/2014 |
| WO | WO 2019/162346 A1 | 8/2019 |
| WO | WO 2021/091838 A1 | 5/2021 |

OTHER PUBLICATIONS

Liu, P. "Accurate Prediction of 3D Mask Topography Induced Best Focus Variation in Full-Chip Photolithography Applications." Proceedings of SPIE, Photomask Technology, vol. 8166, Oct. 13, 2011, pp. 1-8.

Liu, P. et al. "Fast 3D Thick Mask Model for Full-Chip EUVL Simulations." Proceedings of SPIE, Extreme Ultraviolet (EUV) Lithography IV, vol. 8679, Apr. 1, 2013, pp. 1-16.

Liu, P. et al. "Fast and Accurate 3D Mask Model for Full-Chip OPC and Verification." Proceedings of SPIE, vol. 6520, Mar. 26, 2007, pp. 1-12.

PCT International Search Report and Written Opinion, PCT Application No. PCT/US2021/048761, Dec. 22, 2021, 11 pages.

PCT International Search Report and Written Opinion, PCT Application No. PCT/US2022/045380, Feb. 6, 2023, 13 pages.

Zhang, H. et al. "An Accurate ILT-Enabling Full-Chip Mask 3D Model for All-Angle Patterns." SPIE Photomask Technology, vol. 8880, Sep. 9, 2013, pp. 1-10.

Japan Patent Office, Office Action, Japanese Patent Application No. 2023-517378, Feb. 17, 2025, nine pages.

United States Office Action, U.S. Appl. No. 17/897,529, filed May 19, 2025, 13 pages.

\* cited by examiner

MASK SYNTHESIS INTEGRATING MASK FABRICATION EFFECTS AND WAFER LITHOGRAPHY EFFECTS

RELATED APPLICATION

This application claims priority under 35 U.S.C. § 119(e) to U.S. Provisional Patent Application Ser. No. 63/280,841, "Mask Synthesis Integrating Both Mask Fabrication and Wafer Lithography Effects," filed Nov. 18, 2021. The subject matter of all of the foregoing is incorporated herein by reference in their entirety.

TECHNICAL FIELD

The present disclosure relates to mask synthesis, including effects of both mask fabrication and wafer lithography.

BACKGROUND

The manufacture of semiconductor wafers involves wafer lithography and mask fabrication. Wafer lithography refers to the process of transferring device patterns from a lithographic mask onto a wafer. It may also be called wafer process or lithography process. It includes a series of complex process steps such as coating the wafer with a resist film, using the lithographic mask to expose the resist through an optical projection system, baking and developing the resist, and then etching the wafer films uncovered by the remaining resist. Due to various process effects (e.g., optical proximity effect), the actual patterns produced on the wafer (the printed wafer patterns) are distorted and different in shape from the patterns printed on the lithographic mask.

Mask fabrication or mask process refers to the process of fabricating the lithographic mask. The input to the mask fabrication device is typically a file containing a layout design and the outcome is a finished physical lithographic mask. Mask fabrication involves process steps similar to those in wafer lithography. One difference is that mask fabrication may use laser or electron beams to write the pattens directly onto a resist film coated on the mask blank, rather than optical projection. Similar to wafer lithography, due to various process effects, the patterns produced on the physical mask (the printed mask patterns) may deviate from the description of the mask design input to the e-beam writer.

SUMMARY

In some aspects, an integrated model accounts for effects from both the mask fabrication process and the wafer lithography process. A mask fabrication description defines shapes that represent a layout geometry of a lithographic mask input to a mask fabrication process. The mask fabrication process is a process for fabricating the lithographic mask based on the mask fabrication description. A wafer lithography process is a process for patterning a wafer by using the fabricated lithographic mask.

The aerial image incident on the wafer, the pattern printed on the wafer, and/or measures of the foregoing are estimated using an integrated three-dimensional mask (M3D) model, as follows. The shapes in the mask fabrication description are partitioned into feature images. Each feature image is convolved with a corresponding M3D filter. The M3D filter represents an electromagnetic scattering effect of that feature image in the wafer lithography process, and the feature image and/or M3D filter account for effects on the layout geometry from the mask fabrication process. This is done without estimating the mask pattern printed on the lithographic mask. The mask fabrication description is modified based on differences between the estimated lithography results and corresponding target (desired) results.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
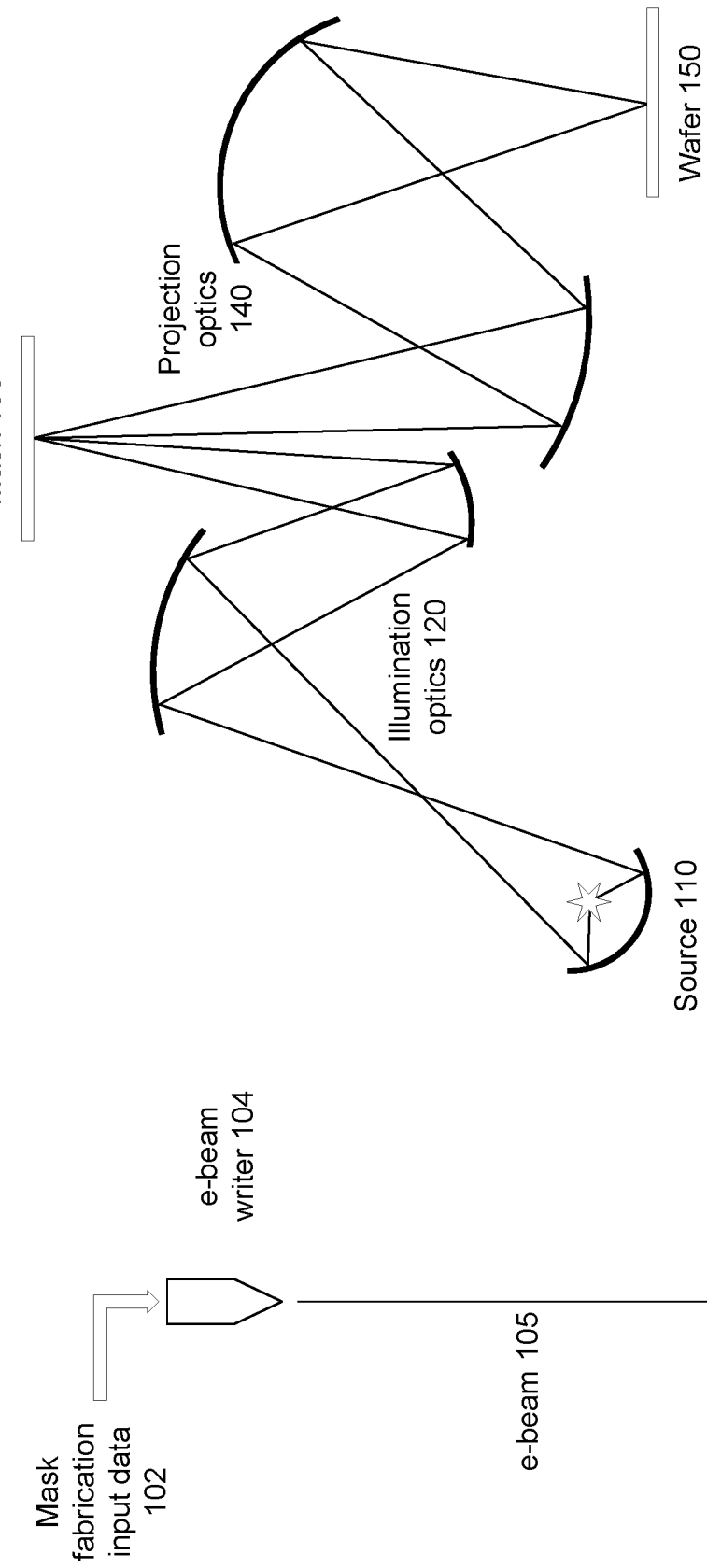
FIG. 1A depicts a mask fabrication process suitable for use with embodiments of the present disclosure.
FIG. 1B depicts an extreme ultraviolet (EUV) wafer lithography process suitable for use with embodiments of the present disclosure.

Aspects of the present disclosure relate to synthesis of lithographic masks that integrates both mask fabrication and wafer lithography effects. The approaches described herein correct the mask design that is input to the mask fabrication process for both mask fabrication and wafer lithography effects in a single computational flow, and without estimating the printed mask pattern.

Traditionally, the effects of wafer lithography and mask fabrication are corrected separately. With respect to wafer lithography, mask synthesis (MS) refers to a process for modifying the layout of the lithographic mask, as input to the wafer lithography process, to account for the effects of the wafer lithography process. This is generally done via a computational flow in which a model of the wafer lithography process is used to predict the printed wafer pattern produced from a given mask pattern (mask layout) applied to the wafer lithography process but ignoring effects of the mask fabrication process. This mask layout is then iteratively modified to minimize the difference between the predicted wafer pattern and the target wafer pattern. Approaches include optical proximity correction (OPC) and inverse lithography technology (ILT). This process may also add sub resolution assist features (SRAF) to improve robustness to process variations.

With respect to mask fabrication, the desired mask layout produced by the above process is not used as the input to the mask fabrication process. Rather, it is further modified to compensate for mask fabrication process effects before being input to the mask writer. This modification procedure is referred to as mask process correction (MPC) or mask error correction (MEC). It is generally done via a computational flow in which a model of the mask fabrication process is used to predict the printed mask pattern from the input data to the mask fabrication process. The input data is iteratively modified to reduce the difference between the predicted mask pattern and the target mask pattern (i.e., the mask pattern corrected for wafer lithography effects). In addition to shape modification, MPC/MEC may also make dose adjustments to improve the process window and edge placement accuracy.

Traditionally, MS and MEC are two separate and independent computational operations to prepare the input data for the mask writer. MS is responsible only for designing a target mask layout, which the wafer lithography process will print to produce the target wafer pattern with good fidelity. MEC is only responsible for generating an input for the mask fabrication process to produce a lithographic mask with the target mask pattern with good fidelity. The handshake between MS and MEC is the full-chip mask layout produced by the MS process.

In contrast, in the approaches described herein, MS and MEC are integrated into a single computational flow where the input data to the mask fabrication process is corrected for both mask fabrication and wafer lithography effects to improve the quality of the final printed wafer. Furthermore, integrated models replace at least some of the separate models used for MS and MEC. For example, the file containing the full-chip mask layout between MS and MEC may be eliminated by using an integrated model that includes mask fabrication processes that occur during fabrication of the lithographic mask and wafer lithography processes that occur as a result of using the fabricated lithographic mask. As one example, an integrated model may take the input data for the mask fabrication process and predict from that the electromagnetic field produced by the corresponding lithographic mask, but without predicting the patterned layout of the lithographic mask itself.

Technical advantages of the present disclosure may include, but are not limited to, the following. Simulating the mask fabrication process and the wafer lithography process together can produce better results, since interactions between the two processes may be better modelled and accounted for. In addition, the use of an integrated model that does not predict the patterned layout of the lithographic mask itself eliminates the file I/O overhead required to write out the mask layout file and then to read it in again. This can be a significant overhead since the mask layout for a full chip can cover a large area populated by very small features. The integrated approach may also decrease required CPU processing power and improve the total cycle time and design turnaround time.

In more detail, FIG. 1A depicts a process for fabricating a lithographic mask from input data defining the mask design, and FIG. 1B depicts an extreme ultraviolet (EUV) wafer lithography process that uses the fabricated lithographic mask. In FIG. 1A, data 102 describing a desired lithographic mask is used to control an electron-beam (e-beam) writer 104. A mask blank 108 is coated with e-beam resist. To create an EUV lithographic mask, the mask blank is typically a substrate coated with alternating layers of Mo and Si which form a Bragg reflector, and then an absorber. Examples of abosorbers are compounds of Ta, for example some form of TaBON. There may also be capping layers, such as Ru.

The e-beam writer 104 controls an e-beam 105 to expose the resist according to the mask fabrication input data 102. The resist is developed, creating a pattern of resist on the mask blank 108. The materials of the underlying blank 108 are then processed. For example, for EUV masks, the underlying blank may contain a multi-layer reflector covered by an absorbing layer. Where the resist has been removed, the absorptive material is exposed and may be etched away to expose the underlying reflector, thus creating a patterned reflective EUV lithographic mask.

The resulting mask is then used as the lithographic mask 130 in the wafer lithography process shown in FIG. 1B. In this system, a source 110 produces EUV light that is collected and directed by collection/illumination optics 120 to illuminate the lithographic mask 130. Projection optics 140 relays the pattern produced by the illuminated mask onto a wafer 150, exposing resist on the wafer according to the illumination pattern. The exposed resist is then developed, producing patterned resist on the wafer. This is used to fabricate patterned structures on the wafer, for example through deposition, doping, etching or other processes.

In FIG. 1B, the light is in the EUV wavelength range, around 13.5 nm or in the range 13.3-13.7 nm. At these wavelengths, the components typically are reflective, rather than transmissive. The mask 130 is a reflective mask and the optics 120, 140 are also reflective and off-axis. This is just an example. Other types of lithography systems may also be used, including at other wavelengths, using transmissive masks and/or optics, and using positive or negative resist.

Note that there are two different fabrication processes in FIGS. 1A and 1B. The mask fabrication process of FIG. 1A starts with mask fabrication input data 102 and produces a physical lithographic mask. The lithographic mask 130 is then used in the wafer lithography process of FIG. 1B to produce the patterned wafer 150.

Figure 2:
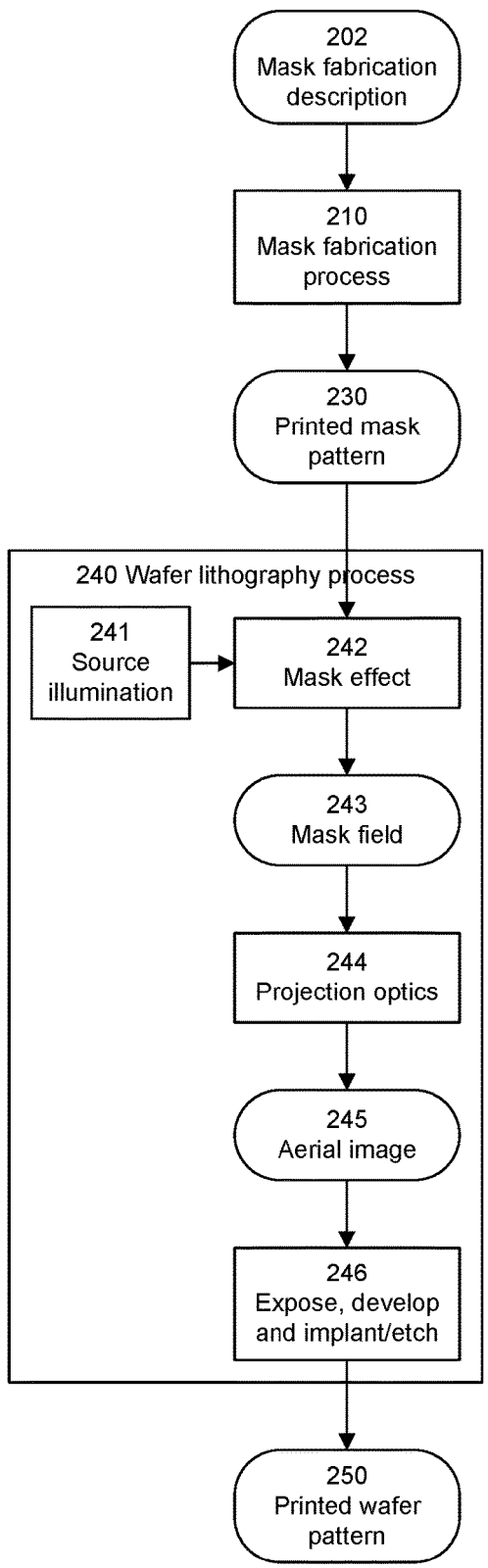
FIG. 2 is a block diagram of the physical processes shown in FIGS. 1A and 1B.

FIG. 2 is a block diagram of the physical processes shown in FIGS. 1A and 1B. The mask fabrication description 202 corresponds to input data 102. The description 202 is a description of the layout geometry as input to the mask fabrication process (as opposed to a description of the layout input to the wafer lithography process). The mask fabrication description 202 may not be exactly the same as the mask fabrication input data 102. For example, it may not be in the specific format required to control an e-beam writer. The mask fabrication description 202 defines the shapes that represent the layout geometry input to the mask fabrication process and e-beam writer. The mask fabrication process 210 corresponds to the process shown in FIG. 1A, and the resulting printed mask pattern 230 is the layout geometry of the resulting lithographic mask (130 in FIG. 1B). At a high level, the printed mask pattern 230 is an input to the wafer lithography process 240, which corresponds to the process shown in FIG. 1B. The result of this process 240 is the printed wafer pattern 250, which corresponds to wafer 150 in FIG. 1B.

In more detail, the wafer lithography process 240 contains the following sub-processes. Source illumination 241 accounts for the source 110 and illumination optics 120 of FIG. 1B and produces the illumination incident on the lithographic mask. Mask effect 242 is the effect of the lithographic mask 130 on the incident illumination. The resulting field is referred to as the mask field 243. It may be represented by a mask function, as described in more detail below. The projection optics 244 corresponds to projection optics 140 in FIG. 1B. It projects the mask field 243 to the wafer 150. The field at that point is referred to as the aerial image 245. Box 246 is the processing of the wafer, which includes exposure by the aerial image, development of the resist and possibly implantation, etching or other processing. The result is the printed wafer pattern 250, which corresponds to physical wafer 150 in FIG. 1B.

Figure 3:
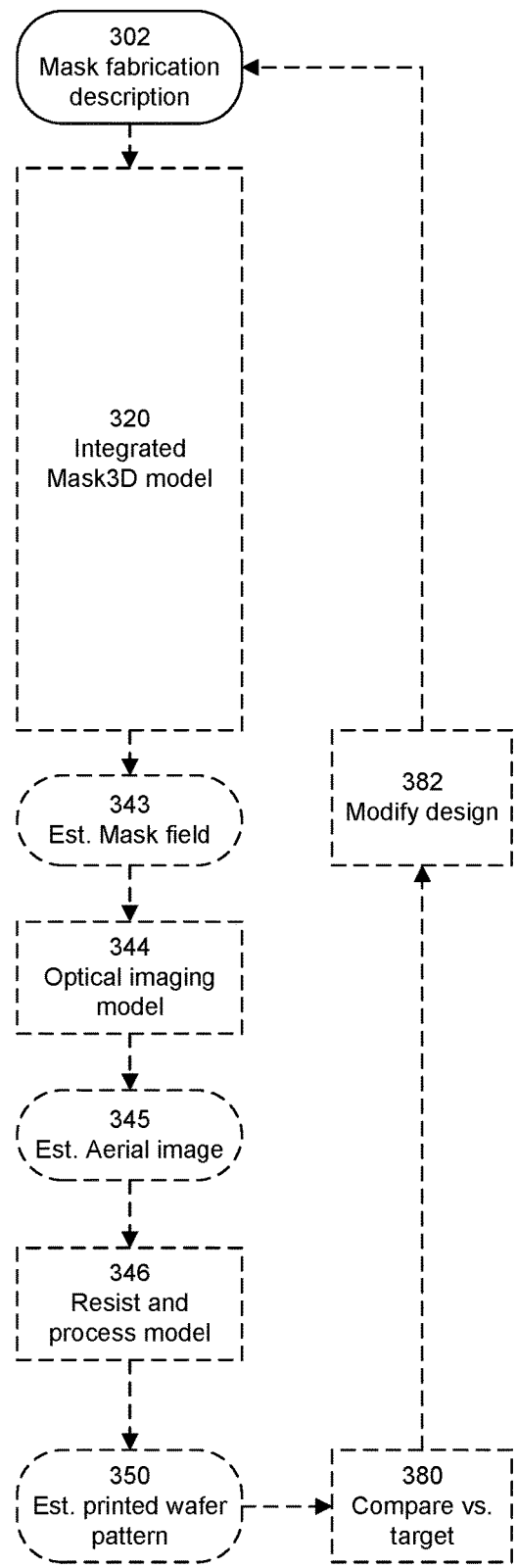
FIG. 3 is a flow diagram of an integrated mask design flow according to embodiments of the present disclosure.

FIG. 3 is a flow diagram of an integrated mask design flow. The flow diagram uses dashed lines to indicate simulations or computational lithography, whereas the solid lines in FIG. 2 indicate physical processes. The flow of FIG. 3 is a process for designing the input 202 to the mask fabrication process. Note that this is a description of the mask design at the beginning of the mask fabrication process 210, not a description of the mask design at the beginning of the wafer lithography process 240. This flow takes the mask fabrication description 302 and estimates the resulting printed wafer pattern 350. At 380, the estimated pattern is compared to the ideal (target) pattern. At 382, the pre-fabrication mask design 302 is modified based on the comparison.

This example flow uses three models: an integrated Mask3D model 320, an optical imaging model 344 and a resist/process model 346. The model 320 is an integrated model, because it includes effects from the mask fabrication process 210 and also effects 242 of the lithographic mask itself including the source illumination 241. As such, the integrated model 320 takes the mask fabrication description 302 as input and produces the estimated mask field 343, without estimating the actual printed mask pattern 230 as an intermediate step. Skipping the printed mask pattern 230 can significantly reduce the amount of data handling and also the amount of computation. If the printed mask pattern 230 were estimated, then one model would have to perform the calculations to estimate the printed mask pattern and write out the result. The printed mask pattern can be a very large file, particularly if a high resolution version of the pattern is required to adequately model the wafer lithography process. The pattern may contain very small features and/or curved features. This file would then have to be read back in and processed by a second model. The use of a single integrated model 320 avoids this intermediate step with all the required data handling.

The integrated model 320 may combine effects from the mask fabrication process 210, the source illumination 241 and the lithographic mask itself 242. If the mask fabrication process 210 is based on an e-beam process, the integrated model 320 may account for electron-beam exposure of the resist on the mask blank, processing of the exposed resist to form patterned resist, and/or etching of the layers on the mask blank with the patterned resist. Other effects encountered during mask fabrication may include back scattered electrons, long range etch effects, etch bias, and micro loading. With respect to the source illumination 241, the integrated model 320 may account for effects resulting from the source 110 itself (including source mask) and/or the illumination optics 120. Mask effects 242 may include effects resulting from mask structures that deviate from nominal, such as non-vertical sidewalls, and stacks of material with slightly different thicknesses or optical properties (e.g., index of refraction). Mask effects 242 may also include mask linearity effects or mask proximity effects. These deviations from nominal are caused by short range proximity effects and depend on the mask features.

The optical imaging model 344 accounts for the effects of the projection optics 244. It estimates the aerial image 345 incident on the wafer, produced by the mask field 343. The remaining model(s) 346 may include effects such as exposure of the resist from the aerial image, chemical development, and subsequent removal, whether by etch or other processes. It may also include subsequent processing, for example, etching, deposition, doping, implantation, etc. The result is an estimate of structures on the wafer, referred to as the printed wafer pattern 350. The printed wafer pattern 350 could be patterns in the resist, or patterns transferred to the wafer itself.

The comparison 380 may be based on different lithography results. It may be a comparison of the estimated resist structure compared to the desired (target) resist structure, or of the estimated structure on the wafer compared to the target structure, or of the aerial image compared to the target aerial image. The comparison may also be based on various metrics of these quantities: contours, minimum or critical dimensions, line separations, line widths, etc.

At 382, the result of comparison 380 is used to modify the mask design 302. For example, sub resolution assist features (SRAF) may be added to improve robustness to process variations. Additional approaches from optical proximity correction (OPC) and/or inverse lithography technology (ILT) may also be used. Because the full flow include both the mask fabrication process and the wafer lithography process, the corrections may also include aspects of mask process correction (MPC) or mask error correction (MEC).

Figure 4:
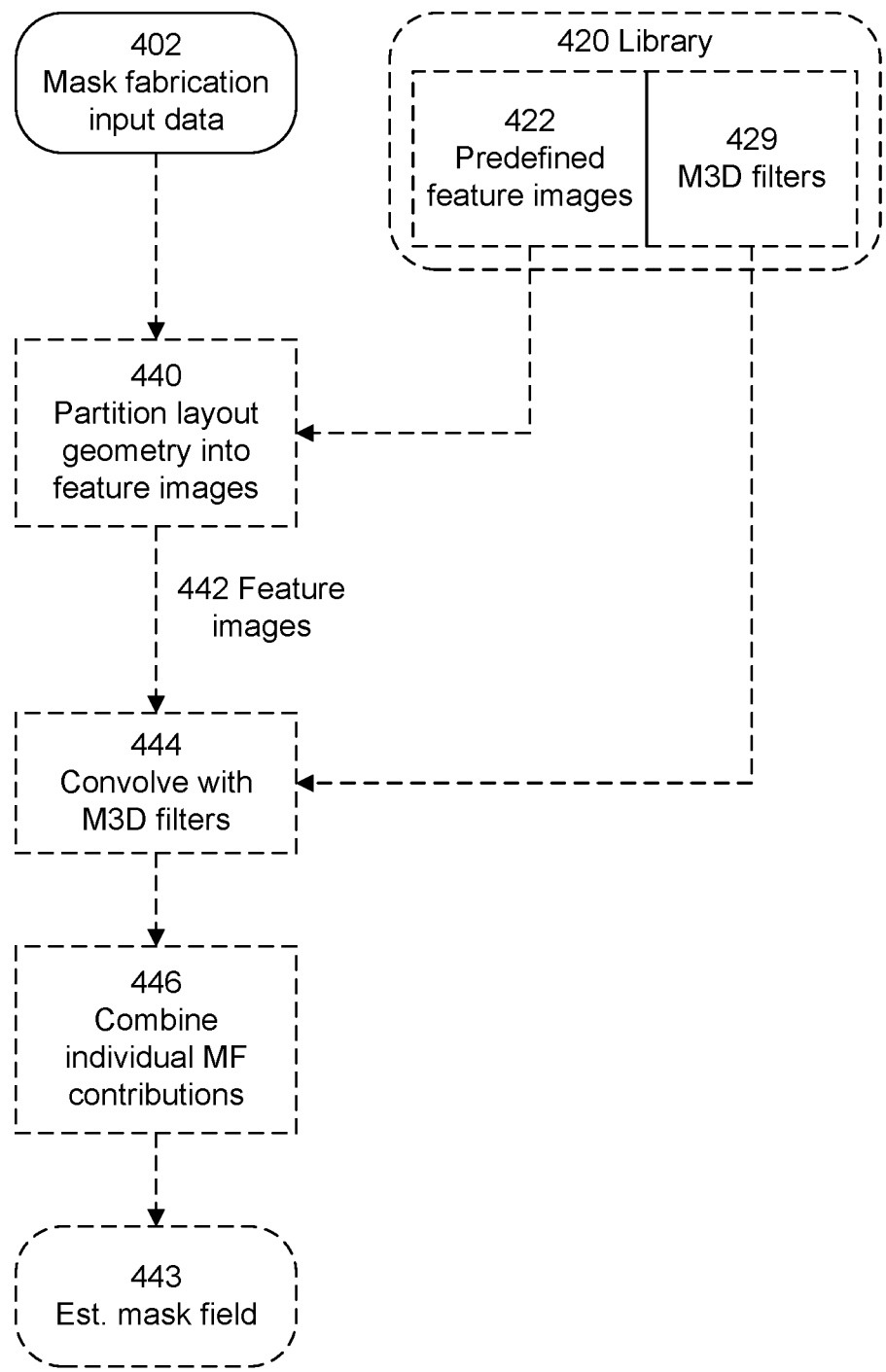
FIG. 4 is a flow diagram for estimating a mask function from a description of a mask according to embodiments of the present disclosure.
Figure 5:
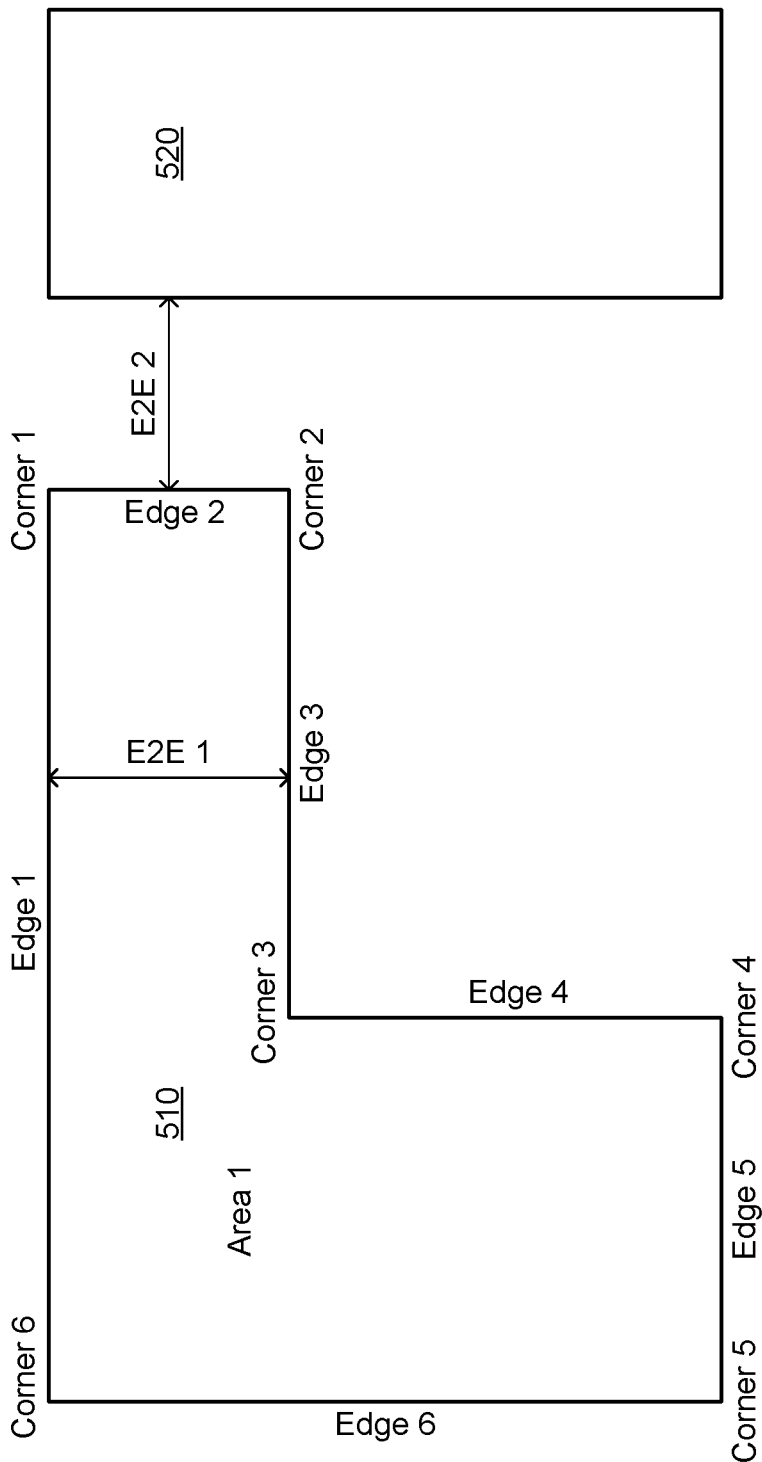
FIG. 5 depicts partitioning a mask layout geometry into feature images.
Figure 6:
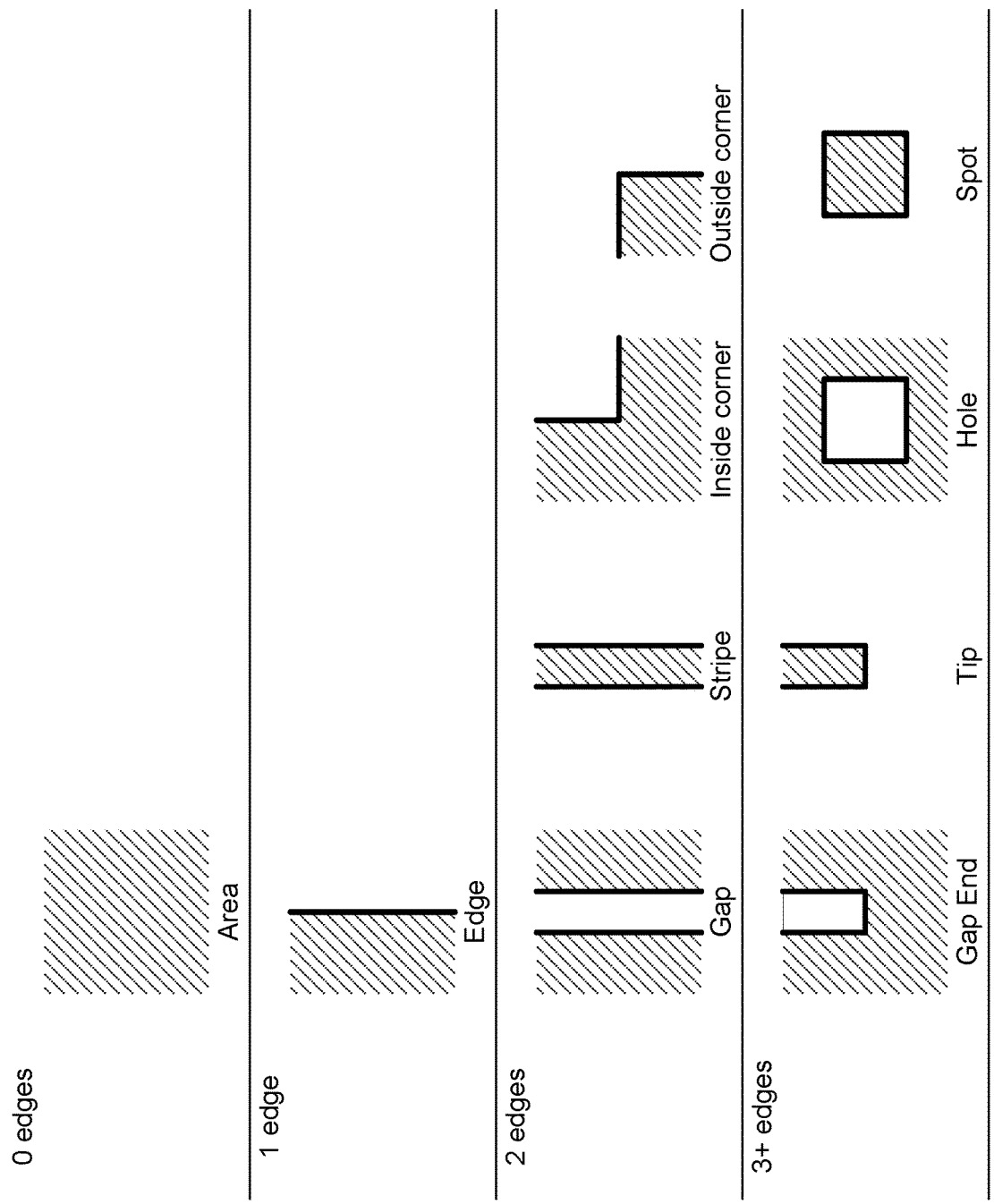
FIG. 6 depicts feature images in a library according to embodiments of the present disclosure.

In some cases, the integrated model 320 is based on partitioning the shapes in description 302 into feature images, and then convolving each feature image with a corresponding M3D filter, as described in more detail in FIGS. 4-6. The aggregate mask field (or mask function) 343 equals the sum of the contributions from each feature image:

$$MF = \Sigma_{i=1}^{N} I_i \otimes K_i \quad (1)$$

where $I_i$ are the feature images, $K_i$ are the corresponding M3D filters, $\otimes$ is the convolution operator, and N is the number of feature images. MF is the aggregate mask function 343.

The M3D model expressed in Eqn. 1 is an integrated model 320, because the convolution operation accounts for effects from both the mask fabrication process 210 and the wafer lithography process 240. For example, the M3D filters $K_i$ may represent electromagnetic scattering effects of different feature images in the wafer lithography process 240. Effects on the layout geometry from the mask fabrication process 210 may be accounted for by adjusting either the feature images $I_i$ and/or the M3D filters Note that Eqn. 1 takes the feature images $I_i$ as inputs, and these are derived from the description 302 of the mask shapes used as input to the mask fabrication process (i.e., not the printed mark pattern 230). From these inputs, Eqn. 1 estimates the mask function 343, but without producing an estimate of the printed mask pattern 230.

FIG. 4 is a flow diagram for estimating a mask function 443 from a description of a mask 402. The process of FIG. 4 uses a library 420 to determine the mask function 443 for the mask. The library contains feature images 422 (e.g., predefined feature images) and corresponding filters 429, which will be referred to as mask 3D (M3D) filters because they represent the contribution to the overall mask function from that type of feature image for a given source illumination. The M3D filters 429 include effects of the mask fabrication process and effects of the wafer lithography process.

As shown in FIG. 4, at 440, the layout geometry of the mask, as defined by data 402, is partitioned into feature images 442, based on the feature images 422 from library 420. At 444, the mask function (MF) contribution from each feature image 442 is calculated by convolving the feature image 442 with the corresponding M3D filter 429. At 446, the aggregate mask function for the mask and given source illumination is determined by combining (e.g., summing) the MF contributions from the individual feature images.

FIG. 5 depicts partitioning a mask layout geometry into feature images. FIG. 5 shows two shapes 510 and 520 and the partitioning of shape 510 into features images. Shape 510 is partitioned into the following features images: one area image, six edge images, six corner images, and two edge-to-edge (E2E) images. The shape 510 may be partitioned into the feature images based on rules to identify different features present in the mask layout. In this example, the interior area of the polygon shape 510 and its contribution to the mask function is represented by the Area 1 feature image. This defines which areas of the mask are opaque versus transmissive or reflective. The edge feature images (Edge 1-Edge 6) account for diffraction and scattering of the electromagnetic wave at edges.

The remaining feature images are based on combinations of two edges, where there will be interaction between the two edges. The corner feature images (Corner 1-Corner 6) account for interactions at corners, which is beyond just the individual contributions of the two edges. Note that in FIG. 5, the corners include both inside corners and outside corners. The edge-to-edge (E2E) feature images account for interactions between parallel edges. E2E 1 accounts for interactions between Edges 1 and 3. E2E 2 accounts for interactions between Edge 2 and the left edge of shape 520.

Each of the feature images is an image. For example, the area image may be the polygon of shape 510. Each of the edge images may be a filtered version of the relevant edge. In some cases, rasterization filters are applied to generate the feature images.

The partitioning of the layout geometry uses feature images 422 from library 420. The feature images in the library may be selected based on an understanding of scattering, and what types of geometric features contribute to scattering.

FIG. 6 depicts some examples of feature images in a library. The features images in FIG. 6 are classified according to the number of edges in the feature image. The feature images in the top row have 0 edges, the ones in the next row have 1 edge, and then 2 edges, and then 3+edges. These are just examples and are not exhaustive.

In the top row, the area feature image determines which areas of the mask are opaque versus transmissive or reflective. Actual instances of the area feature images may have different shapes, sizes and locations, depending on the geometric layout of shapes on the mask. The M3D filter corresponding to the area feature image represents the scattering produced by each point in the area assuming an infinitely large area, i.e., the contribution to the mask function from each point within a bulk area of the geometric layout ignore any edge effects. Hence, the convolution of the M3D filter with an instance of the area feature image (e.g., Area 1 in FIG. 5) yields the MF contribution from the bulk area of that shape in the mask.

In the second row, the edge feature image is another class of feature images, because diffraction or scattering of the electromagnetic wave occurs at edges. FIG. 6 shows one edge feature image, but the library may have many types of edge images. For a mask with only Manhattan geometry, four edge feature images are included in the library, corresponding to the four possible orientations of an edge in the Manhattan geometry. Some masks may also allow edges at multiples of 45 degrees, or even at arbitrary angles. The M3D filter corresponding to the Edge feature image represents the scattering produced by each point along the edge assuming an infinitely long edge.

The third row shows another important class of feature images, which are combinations of two edges. When two edges become close enough, there will be interaction between the two edges. Several examples are shown in FIG. 6. In the first two examples, the two edges are parallel. This is generally referred to as edge-to-edge (labelled E2E in FIG. 5). FIG. 6 shows two different polarities, depending on whether the area between the two edges is filled by mask material or not. In addition to the two different polarities, the library may also contain edge-to-edge feature images with different separations between the edges, and with the edges oriented at different angles (horizontal, vertical, at multiples of 45 degrees, etc.).

In the last two examples of the third row, the two edges are perpendicular to each other. These are corner feature images: an inside corner and an outside corner, depending on the polarity. The library may contain corners oriented at different angles. Other two-edge feature images are also possible. For example, the two edges may be at different angles to each other. The two edges may be separated but not parallel to each other. Thus, the two edges will be slowly converging or diverging. Corners at angles other than 90 degrees are also possible.

The bottom row shows feature images with three or more edges. The first two examples are tips of both polarities. The library may contain versions of different widths and at different angular orientations. The next two examples are holes or vias of both polarities. Different versions may have different widths, heights and angular orientations.

Each of the feature images has a corresponding M3D filter that is used to produce the MF contribution from the feature image. That is, the scattering effects of the feature image are captured by the M3D filter, as are effects from the mask fabrication process.

The feature images $I_i$ and/or the M3D filters $K_i$ for an integrated M3D model may be determined based on existing lithography-only M3D models. M3D models which model only the source illumination 241 and mask effect 242 may already exist. These models are referred to as lithography-only M3D models rather than integrated M3D models, because they account only for effects of the wafer lithography process and do not consider effects of the mask fabrication process. However, they may be developed into integrated M3D models by modifying the existing models to also account for effects of the mask fabrication process.

In one approach, the terms and/or parameters already existing in the lithography-only Mask3D model are tuned to capture the effects of the mask fabrication process. This approach has the advantage of low runtime in order to modify the lithography-only Mask3D model. In another approach, additional model terms and/or parameters are added to the existing lithography-only Mask3D model, for example to capture mask fabrication effects that cannot be adequately modeled by existing terms.

The model form of a lithography-only Mask3D model used in OPC/ILT may be more comprehensive than the form of model used in MEC. Therefore, the integrated M3D model may be expected to be more capable of capturing mask fabrication effects than the existing MEC model.

If the integrated Mask3D model is a parameterized model, it can be calibrated using different combinations of empirical data from the mask fabrication and/or wafer lithography processes, and simulated data. FIGS. 7-10 show different examples. In these examples, the lefthand side is a flow that produces the calibration data and the righthand side is the computational lithography that produces an estimate of the same calibration data. The calibration data and the estimate are compared and used to calibrate the integrated model. In these figures, the solid lines are physical processes and the dashed lines are simulations, using the same processes as shown in FIGS. 2 and 3.

Figure 7:
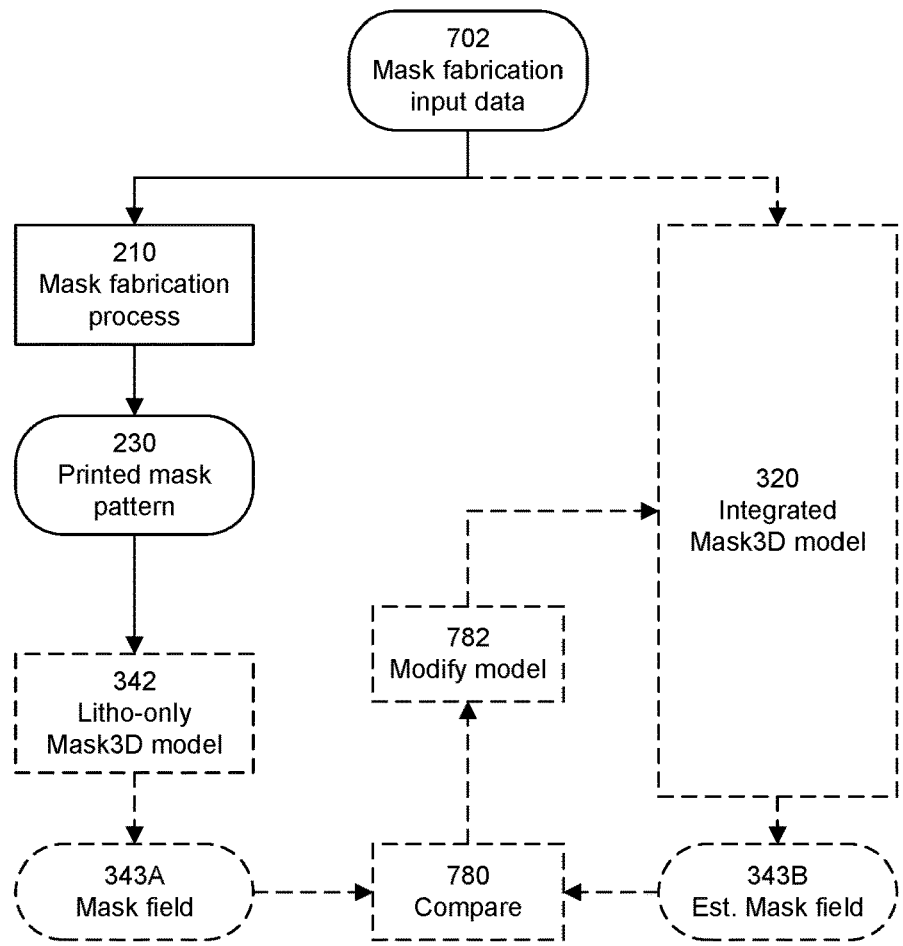
FIG. 7 is a flow diagram of integrated model calibration using mask metrology data according to embodiments of the present disclosure.

FIG. 7 is a flow diagram of integrated model calibration using mask metrology data. In this model calibration scheme, a physical lithographic mask 230 is fabricated. This mask is measured. For example, the contours or dimensions of the printed mark pattern 230 may be measured. A lithography-only Mask3D model 342 is used to estimate the mask function 343A of the printed mask. The integrated Mask3D model 320 is used to predict the mask function 343B from the input test pattern 702. The integrated model 320 is tuned 780, 782 to reduce the difference between the two mask functions 343A, 343B.

Figure 8:
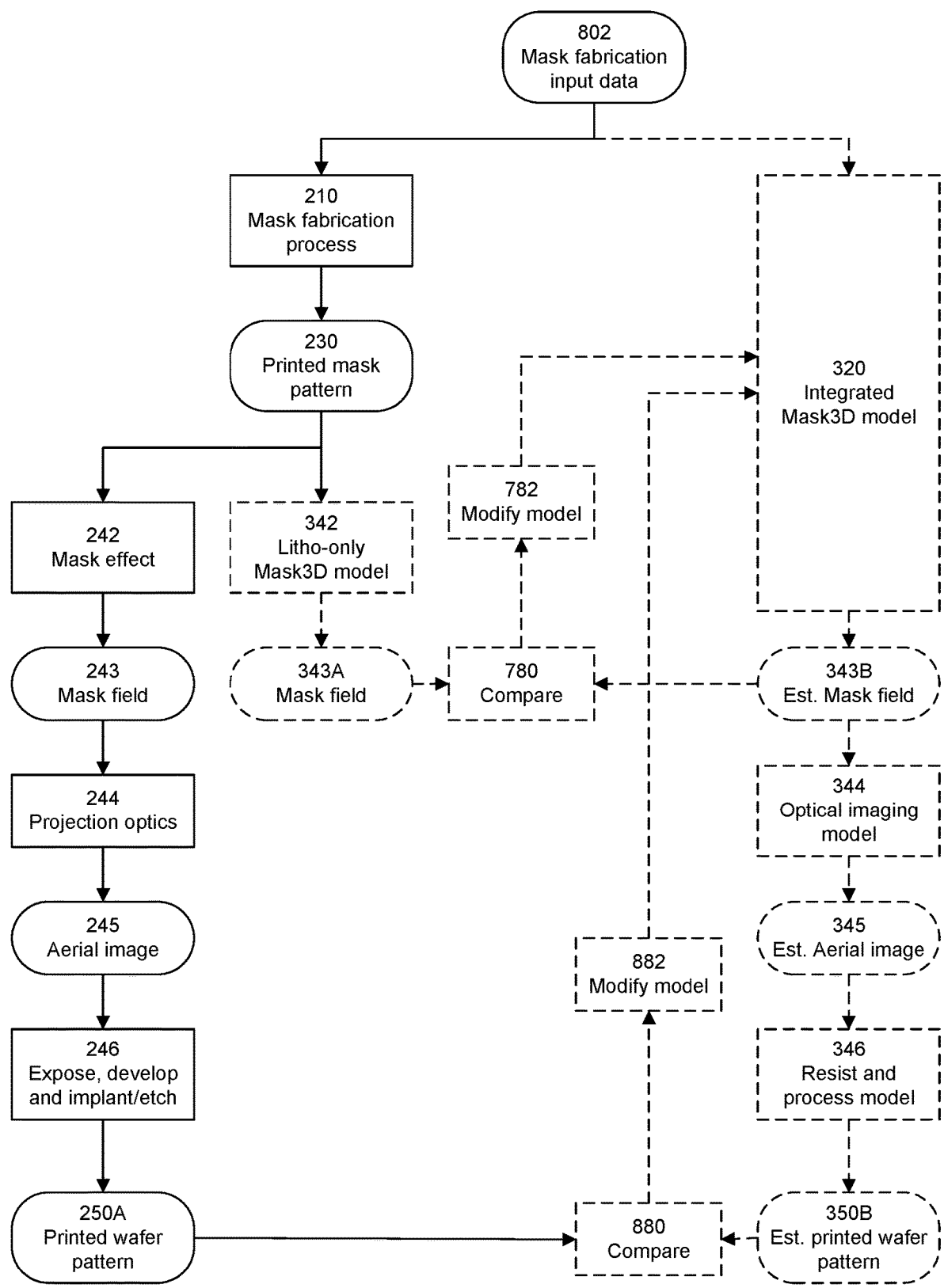
FIG. 8 is a flow diagram of integrated model calibration using both mask and wafer metrology data according to embodiments of the present disclosure.

FIG. 8 is a flow diagram of integrated model calibration using both mask and wafer metrology data. It includes the calibration from FIG. 7 and adds additional calibration based on measurements of fabricated wafers 250A. On the righthand side, the full computational flow also produces estimates of the printed wafer 350B. In this model calibration scheme, the wafer metrology data 250A, such as contours or dimensions of printed patterns on the wafer, is used to form the primary cost function term that drives the model tuning process 880, 882 in a desired direction. The mask metrology data 230 and its corresponding mask function 343A is used to form a secondary cost function term that regularizes the model tuning process 780, 782, constraining the designs within a certain range. This approach may improve the overall model accuracy, especially for wafer pattern predictions.

Figure 9:
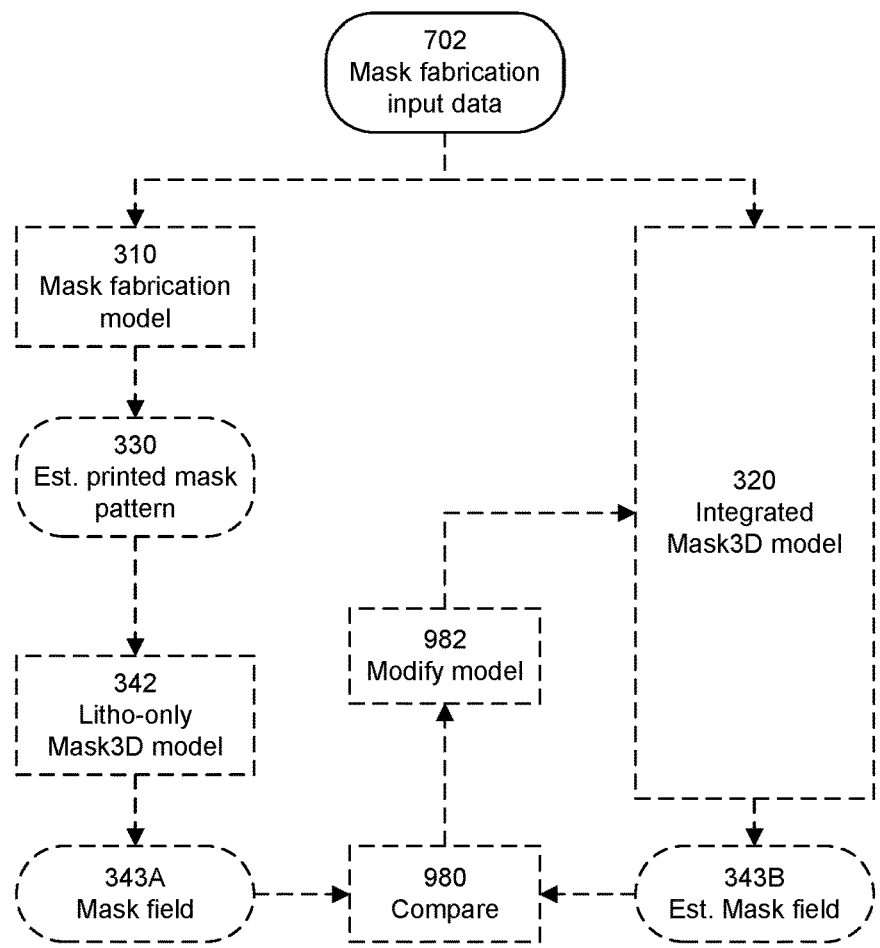
FIG. 9 is a flow diagram of integrated model calibration using simulated data according to embodiments of the present disclosure.

FIG. 9 is a flow diagram of integrated model calibration using only simulation. This is similar to FIG. 7, but fabrication of physical lithographic masks is replaced by simulation. The lefthand side uses a model 310 of only the mask fabrication process followed by a lithography-only M3D model 342. The mask fabrication model 310 predicts the printed mask pattern 330. From this, the lithography-only M3D model 342 estimates the mask function 343A. On the righthand side, the integrated model 320 also estimates the mask function 343B. The two predictions 343A, 343B are compared 980 and used to tune 982 the integrated model 320.

Figure 10:
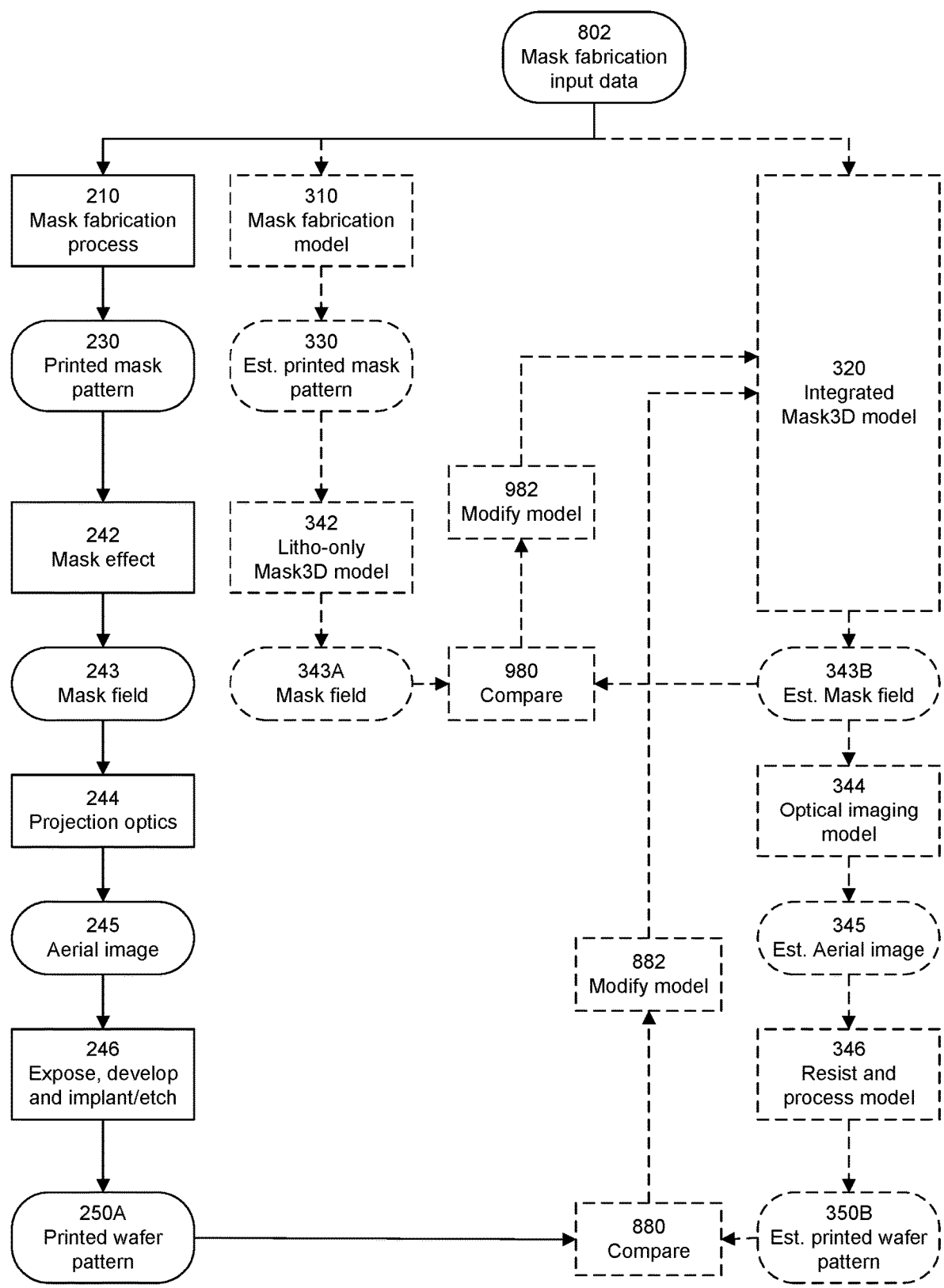
FIG. 10 is a flow diagram of integrated model calibration using simulated data and wafer metrology data according to embodiments of the present disclosure.

FIG. 10 is a flow diagram of integrated model calibration that combines FIGS. 8 and 9. The mask metrology and comparison of mask fields 343A, 343B is simulated, as in FIG. 9. The wafer metrology and comparison of printed wafer patterns 250A, 350b is based on empirical measurements, as in FIG. 8. In this approach, measurements of the fabricated mask are not required.

Figure 11:
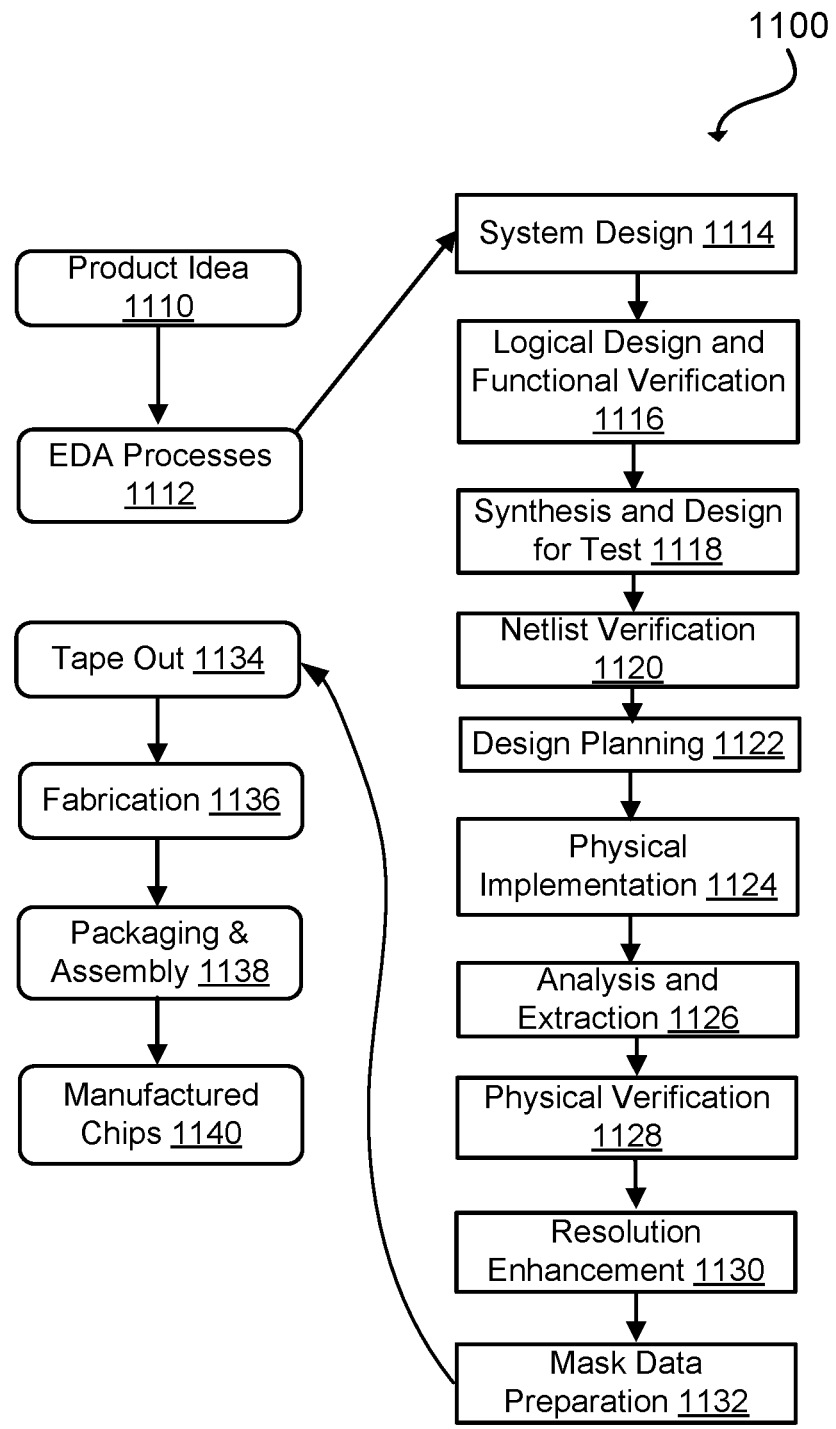
FIG. 11 depicts a flowchart of various processes used during the design and manufacture of an integrated circuit in accordance with some embodiments of the present disclosure.

FIG. 11 illustrates an example set of processes 1100 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1110 with information supplied by a designer, information which is transformed to create an article of manufacture that uses a set of EDA processes 1112. When the design is finalized, the design is taped-out 1134, which is when artwork (e.g., geometric patterns) for the integrated circuit is sent to a fabrication facility to manufacture the mask set, which is then used to manufacture the integrated circuit. After tape-out, a semiconductor die is fabricated 1136 and packaging and assembly processes 1138 are performed to produce the finished integrated circuit 1140.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 11. The processes described by be enabled by EDA products (or tools).

During system design 1114, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1116, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1118, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1120, the netlist is checked for compliance with timing constraints and for correspondence with the HDL code. During design planning 1122, an overall floor plan for the integrated circuit is constructed and analyzed for timing and top-level routing.

During layout or physical implementation 1124, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1126, the circuit function is verified at the layout level, which permits refinement of the layout design. During physical verification 1128, the layout design is checked to ensure that manufacturing constraints are correct, such as DRC constraints, electrical constraints, lithographic constraints, and that circuitry function matches the HDL design specification. During resolution enhancement 1130, the geometry of the layout is transformed to improve how the circuit design is manufactured.

During tape-out, data is created to be used (after lithographic enhancements are applied if appropriate) for production of lithography masks. During mask data preparation 1132, the 'tape-out' data is used to produce lithography masks that are used to produce finished integrated circuits.

A storage subsystem of a computer system (such as computer system 1200 of FIG. 12) may be used to store the programs and data structures that are used by some or all of the EDA products described herein, and products used for development of cells for the library and for physical and logical design that use the library.

Figure 12:
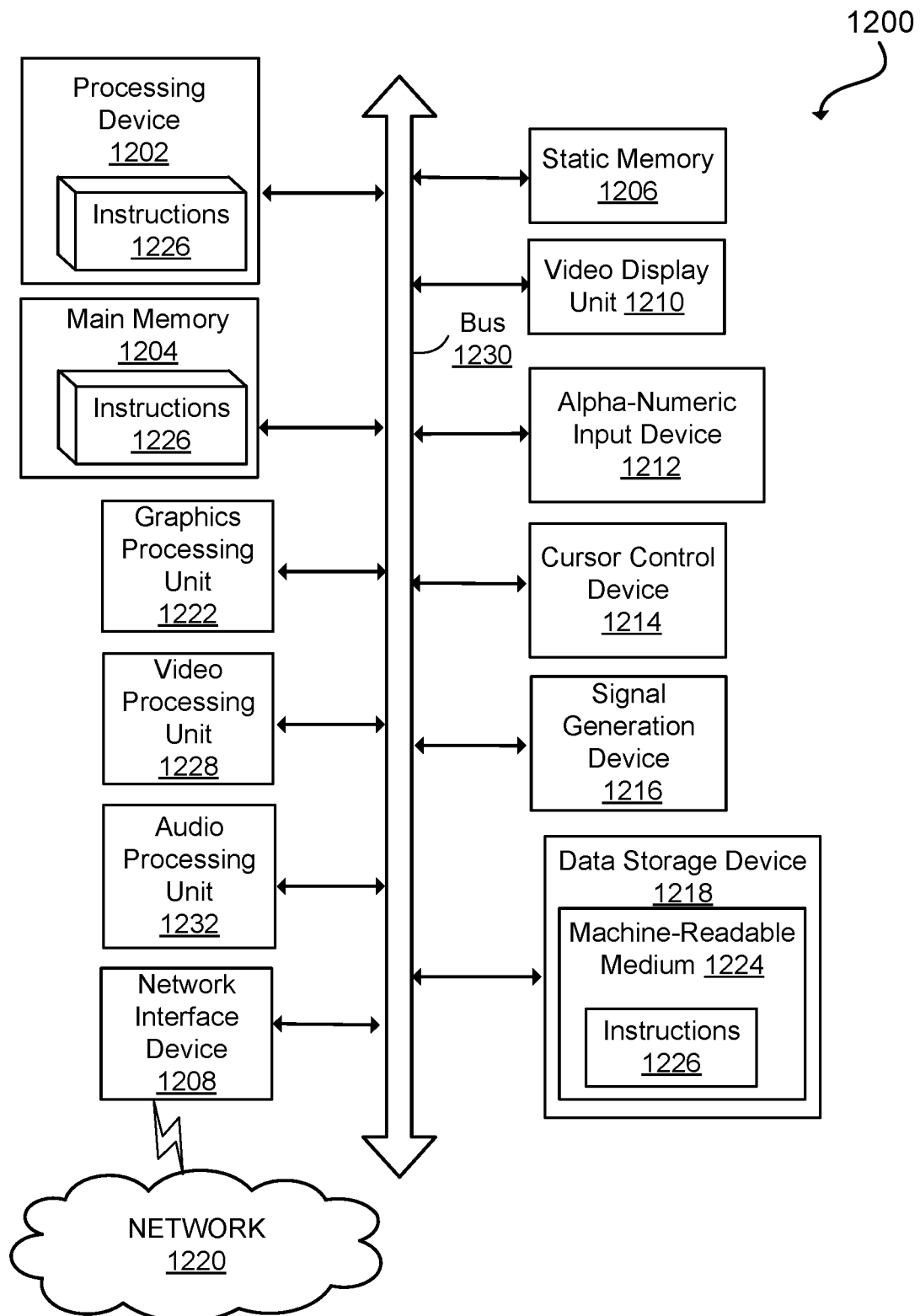
FIG. 12 depicts a diagram of an example computer system in which embodiments of the present disclosure may operate.

FIG. 12 illustrates an example machine of a computer system 1200 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM), a static memory 1206 (e.g., flash memory, static random access memory (SRAM), etc.), and a data storage device 1218, which communicate with each other via a bus 1230.

Processing device 1202 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. The processing device 1202 may be configured to execute instructions 1226 for performing the operations and steps described herein.

The computer system 1200 may further include a network interface device 1208 to communicate over the network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), a graphics processing unit 1222, a signal generation device 1216 (e.g., a speaker), graphics processing unit 1222, video processing unit 1228, and audio processing unit 1232.

The data storage device 1218 may include a machine-readable storage medium 1224 (also known as a non-transitory computer-readable medium) on which is stored one or more sets of instructions 1226 or software embodying any one or more of the methodologies or functions described herein. The instructions 1226 may also reside, completely or at least partially, within the main memory 1204 and/or within the processing device 1202 during execution thereof by the computer system 1200, the main memory 1204 and the processing device 1202 also constituting machine-readable storage media.

In some implementations, the instructions 1226 include instructions to implement functionality corresponding to the present disclosure. While the machine-readable storage medium 1224 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1202 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
  accessing a mask fabrication description that defines a plurality of shapes that represent a layout geometry of a lithographic mask input to a mask fabrication process;
  estimating, by a processing device, a lithography result produced by the mask fabrication process followed by a wafer lithography process, wherein:
    the mask fabrication process is for fabricating the lithographic mask based on the mask fabrication description;
    the wafer lithography process is for patterning a wafer by using the lithographic mask in the wafer lithography process;
    the lithography result comprises at least one of an aerial image incident on the wafer, a pattern printed on the wafer, or a measure of the aerial image or the printed pattern; and
    estimating the lithography result using an integrated three-dimensional mask (M3D) model based on feature images and corresponding M3D filters, comprising:
      partitioning the shapes in the mask fabrication description into feature images; and
      convolving each feature image with the corresponding M3D filter;
      wherein the M3D filter represents an electromagnetic scattering effect of that feature image in the wafer lithography process, and the feature image and/or M3D filter accounts for effects on the layout geometry from the mask fabrication process without estimating a mask pattern printed on the lithographic mask; and
  modifying the mask fabrication description based on differences between the estimated lithography result and a corresponding target result.

2. The method of claim 1 wherein the integrated M3D model comprises a modified version of a lithography-only M3D model, wherein the lithography-only M3D model accounts for electromagnetic scattering effects of the feature image in the wafer lithography process but does not account for effects on the layout geometry from the mask fabrication process.

3. The method of claim 1 wherein the integrated M3D model comprises a lithography-only M3D model plus added parameters to account for effects on the layout geometry from the mask fabrication process, wherein the lithography-only M3D model accounts for electromagnetic scattering effects of the feature image in the wafer lithography process but does not account for effects on the layout geometry from the mask fabrication process.

4. The method of claim 1 wherein the integrated M3D model comprises a lithography-only M3D model with parameters that are modified to account for effects on the layout geometry from the mask fabrication process, wherein the lithography-only M3D model accounts for electromagnetic scattering effects of the feature image in the wafer lithography process but does not account for effects on the layout geometry from the mask fabrication process.

5. The method of claim 1 wherein the integrated M3D model estimates a mask function from the mask fabrication description.

6. The method of claim 5 wherein effects of the mask fabrication process on the layout geometry are captured in the mask function, and not by estimating a mask pattern printed on the lithographic mask.

7. The method of claim 1 wherein estimating the lithography results further comprises:
an optical imaging model following the integrated M3D model, and a resist/etch model following the optical imaging model.

8. A system comprising:
a memory storing instructions and calibration data based on a mask fabrication process and/or
a wafer lithography process, wherein
the mask fabrication process is used to fabricate a lithographic mask based on a mask fabrication description; and
the wafer lithography process uses the lithographic mask to pattern a wafer; and
a processing device, coupled with the memory and to execute the instructions, the instructions when executed cause the processing device to:
estimate the calibration data resulting from the mask fabrication description, wherein the mask fabrication description defines a plurality of shapes that represent a layout geometry of the lithographic mask input to the mask fabrication process, and the estimation uses an integrated three-dimensional mask (M3D) model based on feature images and corresponding M3D filters, comprising:
decomposing the shapes into feature images; and
convolving each feature image with the corresponding M3D filter;
wherein the M3D filter represents an electromagnetic scattering effect of that feature image in the wafer lithography process, and the feature image and/or M3D filter accounts for effects on the layout geometry from the mask fabrication process, but without estimating a mask pattern printed on the lithographic mask; and
calibrating the M3D model based on differences between the stored calibration data and the estimated calibration data.

9. The system of claim 8 wherein the stored calibration data is based on measurements of the fabricated lithographic mask.

10. The system of claim 9 wherein the stored calibration data is based on measurements of the fabricated lithographic mask followed by a lithography-only M3D model that accounts for electromagnetic scattering effects of the feature image in the wafer lithography process but does not account for effects on the layout geometry from the mask fabrication process.

11. The system of claim 8 wherein the stored calibration data is based on measurements of the patterned wafer.

12. The system of claim 11 wherein estimating the calibration data further comprises: an imaging model following the integrated M3D model, and a resist/etch model following the imaging model.

13. The system of claim 8 wherein the stored calibration data comprises first calibration data based on measurements of the fabricated lithographic mask and second calibration data based on measurements of the patterned wafer.

14. The system of claim 13 wherein calibrating the M3D model is driven by the second calibration data and is regularized by the first calibration data.

15. The system of claim 8 wherein the stored calibration data is based on a combination of measurements of the fabricated lithographic mask and/or the patterned wafer, and simulation of the wafer lithography process.

16. A non-transitory computer readable medium comprising stored instructions, which when executed by a processing device, cause the processing device to:
access a mask fabrication description that defines a plurality of shapes that represent a layout geometry of a lithographic mask input to a mask fabrication process;
estimate, by the processing device, a lithography result produced by a mask fabrication process followed by a wafer lithography process, wherein:
the mask fabrication process is for fabricating the lithographic mask based on the mask fabrication description;
the wafer lithography process is for patterning a wafer by using the lithographic mask in the wafer lithography process;
the lithography result comprises at least one of an aerial image incident on the wafer, a pattern printed on the wafer, or a measure of the aerial image or the printed pattern; and
estimating the lithography result uses an integrated three-dimensional mask (M3D) model based on feature images and corresponding M3D filters, comprising:
partitioning the shapes in the mask fabrication description into feature images; and
convolving each feature image with the corresponding M3D filter;
wherein the M3D filter represents an electromagnetic scattering effect of that feature image in the wafer lithography process, and the feature image and/or M3D filter accounts for effects on the layout geometry from the mask fabrication process without estimating a mask pattern printed on the lithographic mask; and; and
modify the mask fabrication description based on differences between the estimated lithography result and a corresponding target result.

17. The non-transitory computer readable medium of claim 16 wherein modifying the mask fabrication description comprises adding sub resolution assist features.

18. The non-transitory computer readable medium of claim 16 wherein modifying the mask fabrication description comprises optical proximity correction or inverse lithography technology.

19. The non-transitory computer readable medium of claim 16 wherein modifying the mask fabrication description comprises mask proximity correction or mask error correction.

20. The non-transitory computer readable medium of claim 16 wherein the mask fabrication process comprises an e-beam mask writing process, and the wafer lithography process comprises an extreme ultraviolet wafer lithography process.

* * * * *